United States Patent [19]
Chin et al.

[11] Patent Number: 5,430,602
[45] Date of Patent: Jul. 4, 1995

[54] INPUT PROTECTION CIRCUIT FOR PROTECTING AN INTERNAL CIRCUIT OF A SEMICONDUCTOR DEVICE FROM ELECTROSTATIC DISCHARGE

[75] Inventors: Dae-Je Chin; Jong-Hyeon Choi, both of Seoul, Rep. of Korea

[73] Assignee: Samsung Electronics Co., Ltd., Suwon, Rep. of Korea

[21] Appl. No.: 41,224

[22] Filed: Mar. 31, 1993

[30] Foreign Application Priority Data

Mar. 31, 1992 [KR] Rep. of Korea .................. 5352/1992

[51] Int. Cl.$^6$ ............................................... H02H 3/20
[52] U.S. Cl. ...................................... 361/212; 361/91; 361/111; 257/360
[58] Field of Search .................... 361/56, 91, 111, 212, 361/220; 257/360, 368

[56] References Cited

U.S. PATENT DOCUMENTS 4,745,450  5/1988  Hartranft et al. ................. 257/360
4,937,700  6/1990  Iwahashi ............................. 257/368
5,027,252  6/1991  Yamamura ........................... 361/58

OTHER PUBLICATIONS

Duvvury et al., "Internal Chip ESD Phenomena Beyond the Protection Circuit", IEEE, 1988, vo. 35, No. 12, pp. 2133–2139.

*Primary Examiner*—Jeffrey A. Gaffin
*Attorney, Agent, or Firm*—Charles R. Donohoe; Robert A. Westerlund, Jr.; Stephen R. Whitt

[57] ABSTRACT

A circuit is provided for protecting the internal circuit of a semiconductor device from electrostatic discharge (ESD). This circuit includes an input pad for applying an input signal to the internal circuit, a metal line for electrically connecting the input pad and internal circuit. This metal line has at least one RC delay stage caused by inherent parasitic resistances and capacitances. Also, a punch-through element is provided to connect the metal line to a ground voltage terminal disposed between the input pad and a delay stage. Finally, a resistor is used to connect the at least one delay stage to the internal circuit.

10 Claims, 2 Drawing Sheets

(PRIOR ART) FIG. 1

INPUT PROTECTION CIRCUIT FOR PROTECTING AN INTERNAL CIRCUIT OF A SEMICONDUCTOR DEVICE FROM ELECTROSTATIC DISCHARGE

BACKGROUND OF THE INVENTION

1. Field of the Invention

The present invention relates to a circuit for protecting an internal circuit of a semiconductor device from electrostatic discharge (ESD) phenomena.

2. Description of the Related Art

Semiconductor memory devices are generally provided with input protection circuitry for protecting internal circuits of a chip from a high electrostatic voltage applied from the exterior of the chip.

While MOS circuits are optimized internally for voltages around 5 v, these circuits can encounter much higher voltages on the inputs. A MOS device is particularly sensitive to high voltage discharges which can rupture a thin gate oxide layer therein.

High electrostatic discharges can originate from the human body, which can generate charges exceeding 2000 v, or from poorly grounded equipment such as test machines.

High electrostatic discharges can also originate from noisy environments such as are encountered in automotive applications or consumer applications such as personal computers. For this reason, input protection circuitry designed to withstand voltages on the order of 2000 v or more is common in CMOS circuits.

Conventional input protection circuits, such as that shown in FIG. 1, include an ESD prevention element, such a thick field device (TFD), which is provided close to an input pad 1 of a chip input terminal.

The TFD is designed such that a field oxide layer is interposed between two n+ diffusion regions. The TFD transfers a charge from one n+ diffusion region to the other so as to undergo a punch-through effect across its channel region. As a result, an excessively high voltage current, caused by a high electrostatic discharge voltage present at input pad 1, is driven to a ground voltage terminal Vss (hereon ground).

Input pins are generally provided as input terminals to a chip. Each input pin usually includes a pad so as to buffer an externally provided input voltage thereto. Consequently, an electrostatic voltage may be adversely introduced as a signal to an input pin through contact with its input pad.

The ESD phenomena and preventive measures thereof are described in detail in an article entitled, "Internal Chip ESD Phenomena Protection Circuit", published in IEEE TRANSACTION ON ELECTRON DEVICES, PP.2133-2139, Vol.35, No.12, December 1989.

In addition, Korean Patent Application No. 91-1128 discloses a circuit, shown here as prior art FIG. 1, for preventing ESD between an input pad, a source voltage terminal, and a ground voltage terminal. An n+ diffusion region, separated by a field oxide layer, is connected between the input pad and ground such that a high voltage current introduced at the input pad and caused by static electricity is bypassed (driven) to ground.

This is accomplished by taking advantage of a technique fundamentally understood as the punch-through phenomena of an n+ diffusion region which is separated by a field oxide layer.

As explained above, FIG. 1 relates to a conventional circuit for protecting an internal circuit from electrostatic discharge. This circuit is shown connected to input pad 1 and internal circuit 20, all of which are connected by metal line 10. Internal circuit 20 receives a supply voltage Vcc and may include, for example, P-type transistor P1 and N-type transistor N1.

As explained above, the thick field device (TFD) is used to essentially bypass ESD to ground. MOS diode T1, used as a clamping circuit, is connected in parallel with the TFD element, both of which are connected between metal line 10 and ground voltage terminal Vss.

There is also provided a resistor R1 comprised of an n+ diffusion region which is connected between node 11 of metal line 10 and node 12 of metal line 10.

Resistor R1 has a high resistance value and is used to protect gate oxide layer 21, in NMOS transistor N1 of internal circuit 20, from an ESD stress voltage.

This is because when an ESD stress voltage is applied from input pad 1 to metal line 10 (about 3000 V may be used here as an appropriate test voltage), a high voltage current is instantly discharged through the TFD. This high stress voltage potential is simultaneously dropped across resistor R1 before an excessive current can otherwise destructively drive the MOS internal circuit 20.

Consequently, ESD stress voltage is prevented from destructively affecting internal circuit 20.

However, the above conventional circuit is found to exhibit a long RC delay time $\tau 1$ during normal input signal transmission. This long RC delay time $\tau 1$ is caused by parasitic components induced between node 12 and internal circuit 20, i.e., parasitic resistance r1 and capacitances c1 and c2.

The RC delay time $\tau 1$ may be expressed by Eq. 1.

$$\tau 1 = R1.c1 + (R1+r1).c2 = R1(c1+c2) + r1.c2 \quad \ldots \text{(Eq.1)}$$

If we approximate R1, r1, c1 and c2 to be, respectively, 500Ω, 200Ω, 2pF and 2pF, then the RC delay time $\tau 1$ is about 2.4 ns.

From equation 1, it should be clear that the RC delay time $\tau 1$ increases for greater resistances and capacitances, such values being directly affected by the length of metal line 10.

As a consequence, greater RC delay times delay the transmission speed of an input signal from input pad 1 to internal circuit 20. While resistor R1 is necessary to reduce the ESD stress voltage to internal circuit 20, its high parametric value results in the disadvantageous characteristic of excessive delay of an input signal, thus reducing overall transmission speed.

SUMMARY OF THE INVENTION

It is an object of the present invention to provide a circuit for protecting an internal circuit from electrostatic discharge that reduces an RC delay time of an input signal.

It is another object of the present invention to provide a semiconductor device with input circuitry for protecting an internal circuit therein from electrostatic discharge, while also reducing an RC delay time of an input signal.

It is another object of the present invention to provide input circuitry for protecting an internal circuit, with a resistor coupled to a gate oxide layer of a MOS transistor (of the internal circuit), from an externally applied ESD stress voltage, the resistor coupled so as to have a negligible effect on the RC delay time of an input signal.

The present invention includes an input protection circuit for protecting an internal circuit of a semiconductor device from electrostatic discharge. This circuit includes an input pad for applying an input signal to the internal circuit, and a metal line for electrically connecting the input pad to the internal circuit.

This metal line has an RC delay stage caused by inherent parasitic resistances and capacitances. A punch-through element connects the metal line to ground between the input pad and the delay stage, and a resistor is provided after the delay stage and before the internal circuit.

BRIEF DESCRIPTION OF THE DRAWINGS

The present invention will now be described more specifically with reference to the drawings attached only by way of example.

DETAILED DESCRIPTION OF THE PREFERRED EMBODIMENTS

Figure 2:
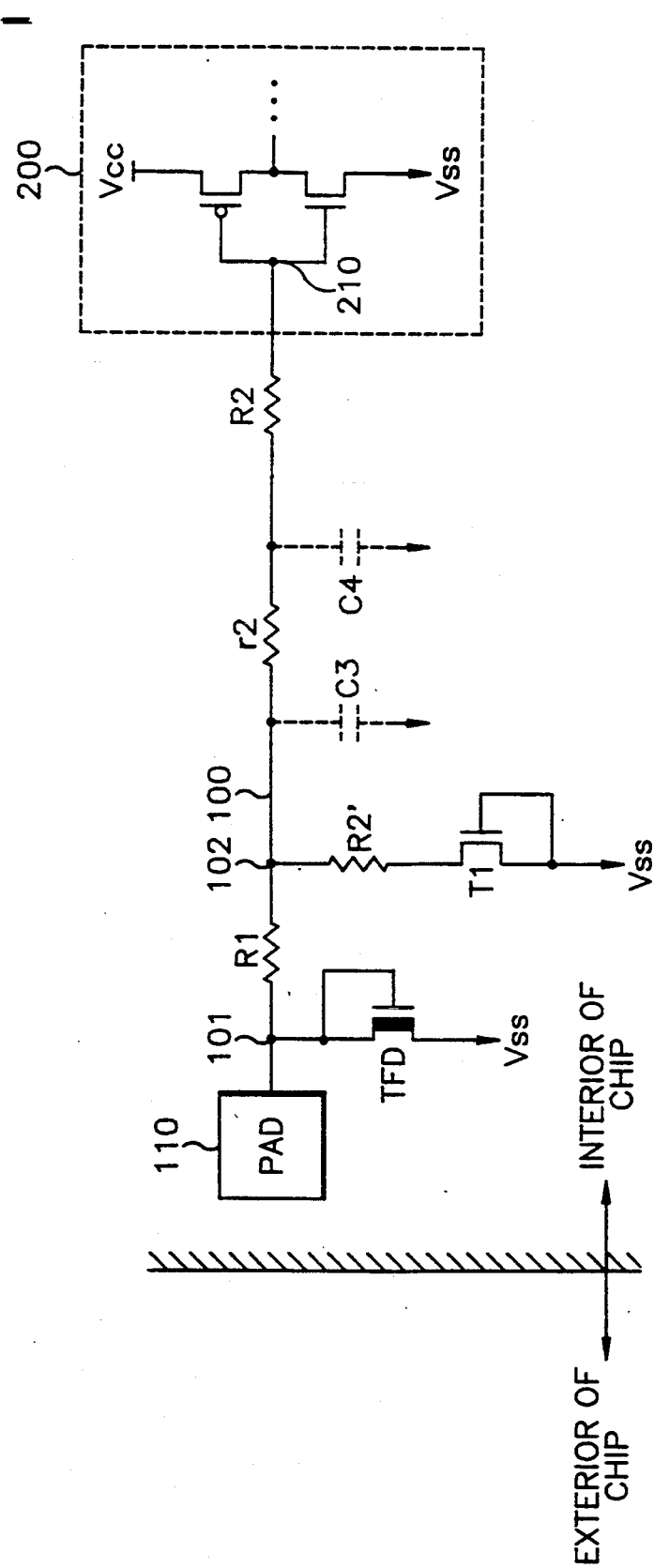
FIG. 2 is a circuit for protecting an internal circuit from electrostatic discharge according to an embodiment of the present invention.
Figure 2:
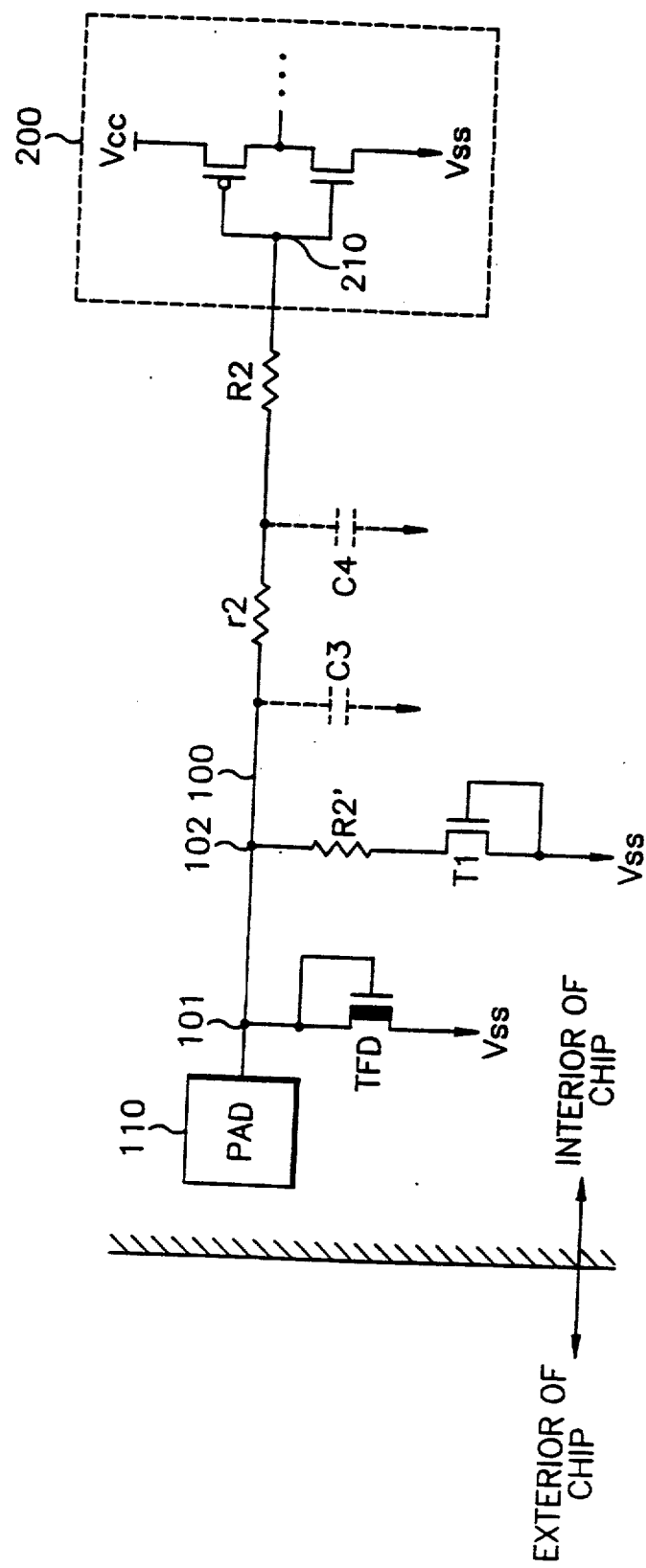

FIG. 2 shows a metal line 100 connecting input pad 110 with internal circuit 200.

Figure 1:
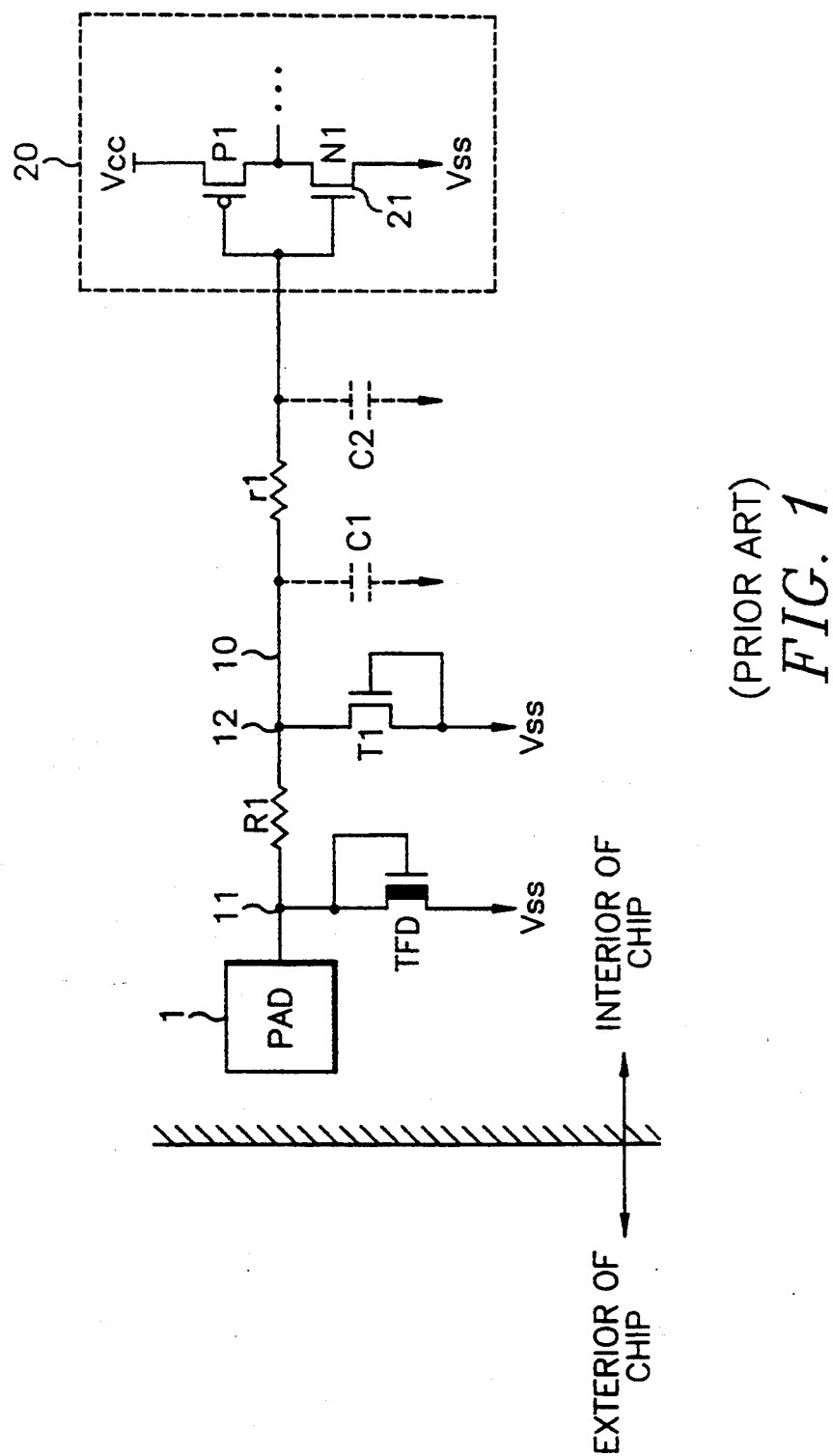
FIG. 1 is a conventional circuit for protecting an internal circuit from electrostatic discharge.

A TFD is shown connected between node 101 and ground voltage terminal Vss, substantially as in the conventional input protection circuit shown in FIG. 1. Resistor R2' and MOS diode T1 are, however, provided and uniquely cascaded between node 102 and ground voltage terminal Vss.

Resistor R2' protects MOS diode T1 which serves as a clamping circuit against very high ESD stress voltages.

Internal circuit 200 is, by way of example, an inverter circuit, as conventionally employed in many MOS integrated circuit input stages.

Parasitic resistance r2 and capacitances c3 and c4 necessarily exist between node 102 and internal circuit 200 along metal line 100.

In addition, resistor R2, connected to input terminal node 210 within internal circuit 200, is provided to protect the gate oxide layers of the MOS transistors in internal circuit 200, from ESD stress voltages.

Resistors R2' and R2 are comprised of n+ diffusion regions. Resistor R2 is connected between an RC delay stage and internal circuit 200 to protect the latter from an ESD stress voltage.

The RC delay stage consists of parasitic resistance r2 and capacitance c4, and input terminal node 210 within internal circuit 200.

Consequently, because there is no non-negligible resistance across nodes 101 and 102, and because resistor R2 has no associated parasitic capacitance, the only components having an influence on RC delay time, in the present circuit, are parasitic resistance r2 and capacitance c4.

Hence, RC delay time $\tau 2$ may be expressed by Eq. 2.

$$\tau 2 = r2 \cdot c4 \quad \ldots \text{(Eq. 2)}$$

If we again approximate values for parasitic resistance r2 and capacitance c4 to be 200Ω and 2pF respectively, then the RC delay time $\tau 2$ is about 0.4 ns.

Thus, the delay stage of the present invention, reduces delay time by 2 ns when compared to the RC delay time $\tau 1$ (=2.4 ns) of the conventional circuit shown in FIG. 1.

In the present embodiment, values for resistors R2' and R2 were set to 500Ω to protect the gate oxide layers in the MOS transistor of internal circuit 200 from high ESD stress voltages.

While resistance values for resistors R2' and R2 can be selected to have greater values than 500Ω to protect against greater ESD stress voltages, RC delay time will not be adversely affected. This is because RC delay time $\tau 2$ is only a function of parasitic resistance and capacitance values which are physically inherent along metal line 100, metal line 100 connecting input pad 110 to internal circuit 200. Also, it is to be understood that parasitic resistance is proportional to the length of metal line 100.

Thus, in accordance with the present invention, resistor R2 used to protect internal circuit 200 from electrostatic discharge is uniquely arranged so as not to adversely affect overall RC delay time $\tau 2$.

As a result, input signal delay time is considerably reduced by the electrostatic discharge protection circuit of the present invention.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A circuit for protecting an internal circuit of a semiconductor memory device from electrostatic discharge, comprising:

an input pad for applying an input signal to said internal circuit;

a conduction line for electrically connecting said input pad to said internal circuit, said conduction line having an RC delay stage comprised of inherent parasitic resistance and capacitance parameters;

a punch-through element, coupled between said input pad and said RC delay stage, for connecting said conduction line to ground; and a first resistor connected between said RC delay stage and said internal circuit for reducing an RC delay time of said RC delay stage.

2. A circuit as defined in claim 1, wherein said first resistor is connected to a gate of a MOS transistor provided in said internal circuit.

3. A circuit as defined in claim 2, wherein said first resistor is a diffusion region comprised of a conductive material.

4. A circuit as defined in claim 1, further comprising a second resistor connected in series with a clamping circuit, cascadedly connected between said input pad and said RC delay stage, for connecting said conduction line to ground.

5. A circuit for protecting an internal circuit of a semiconductor device from electrostatic discharge, comprising:

an input pad for applying an input signal to said internal circuit;

a conduction line for electrically connecting said input pad to said internal circuit, said conduction line having an RC delay stage comprised of inherent parasitic resistance and capacitance parameters;

a punch-through element, coupled between said input pad and said RC delay stage, for connecting said conduction line to ground;

a first resistor for connecting said RC delay stage to said internal circuit; and a second resistor connected in series with a clamping circuit, cascadedly connected between said input pad and said RC delay stage, for connecting said conduction line to ground.

6. A circuit as defined in claim 5, wherein said first resistor is connected to a gate of a MOS transistor provided in said internal circuit.

7. A circuit as defined in claim 6, wherein said first resistor is a diffusion region comprised of a conductive material.

8. A semiconductor device comprising:
an input pad;
an internal circuit;
a conduction line for electrically connecting said input pad to said internal circuit, said conduction line having an RC delay stage comprised of inherent parasitic resistance and capacitance parameters;

a punch-through element, coupled between said input pad and said RC delay stage, for connecting said conduction line to ground;

a first resistor connected between said RC delay stage and said internal circuit for reducing an RC delay time of said RC delay stage; and a second resistor connected in series with a clamping circuit, cascadedly connected between said input pad and said RC delay stage, for connecting said conduction line to ground.

9. A semiconductor device as defined in claim 8, wherein said first resistor is connected to a gate of a MOS transistor provided in said internal circuit.

10. A semiconductor device as defined in claim 9, wherein said first resistor is a diffusion region comprised of a conductive material.

* * * * *

UNITED STATES PATENT AND TRADEMARK OFFICE
CERTIFICATE OF CORRECTION

PATENT NO.    :    5,430,602           Page 1 of 2
DATED         :    July 4, 1995
INVENTOR(S)   :    CHIN et al.

It is certified that error appears in the above-identified patent and that said Letters Patent is hereby corrected as shown below:

Delete Drawing sheet 2 of 2, and substitute therefor the drawing sheet, consisting of fig. 2, as shown on the attached page.

Signed and Sealed this

Thirty-first Day of December, 1996

Attest:

BRUCE LEHMAN

*Attesting Officer*    *Commissioner of Patents and Trademarks*